United States Patent
Tailliet

(10) Patent No.: US 9,899,090 B2
(45) Date of Patent: Feb. 20, 2018

(54) METHOD FOR WRITING INTO AND READING A MULTI-LEVELS EEPROM AND CORRESPONDING MEMORY DEVICE

(71) Applicant: STMicroelectronics (Rousset) SAS, Rousset (FR)

(72) Inventor: François Tailliet, Fuveau (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 15/608,770

(22) Filed: May 30, 2017

(65) Prior Publication Data

US 2017/0263320 A1    Sep. 14, 2017

Related U.S. Application Data

(62) Division of application No. 14/511,661, filed on Oct. 10, 2014, now Pat. No. 9,711,230.

(30) Foreign Application Priority Data

Oct. 25, 2013 (FR) ...................................... 13 60418

(51) Int. Cl.
| | |
|---|---|
| *G11C 11/34* | (2006.01) |
| *G11C 16/10* | (2006.01) |
| *G11C 16/26* | (2006.01) |
| *G11C 16/12* | (2006.01) |
| *G11C 16/34* | (2006.01) |
| *G11C 11/56* | (2006.01) |

(52) U.S. Cl.
CPC ........ *G11C 16/102* (2013.01); *G11C 11/5628* (2013.01); *G11C 16/12* (2013.01); *G11C 16/26* (2013.01); *G11C 16/3481* (2013.01); *G11C 16/3495* (2013.01); *G11C 2211/5622* (2013.01); *G11C 2211/5624* (2013.01); *G11C 2211/5632* (2013.01)

(58) Field of Classification Search
CPC .......... G11C 16/34; G11C 16/00; G11C 16/12
USPC ....................................... 365/185.03, 185.17
See application file for complete search history.

(56) References Cited

U.S. PATENT DOCUMENTS

| | | | |
|---|---|---|---|
| 5,043,940 | A | 8/1991 | Harari |
| 5,293,560 | A | 3/1994 | Harai |
| 5,638,320 | A | 6/1997 | Wong et al. |
| 5,677,873 | A | 10/1997 | Choi et al. |
| 5,892,714 | A | 4/1999 | Choi |

(Continued)

FOREIGN PATENT DOCUMENTS

EP           1024527 A2     8/2000

OTHER PUBLICATIONS

Hisamune, Y. et al., "A High Capacitive-Coupling Ratio (HiCR) Cell for 3 V-Only 64 Mbit and Future Flash Memories," Electron Devices Meeting, Dec. 5-8, 1993, 4 pages.

*Primary Examiner* — Han Yang
(74) *Attorney, Agent, or Firm* — Slater Matsil, LLP

(57) ABSTRACT

During a phase of programming the cell, a first voltage is applied to the source region and a second voltage, higher than the first voltage, is applied to the drain region until the cell is put into conduction. The numerical value of the item of data to be written is controlled by the level of the control voltage applied to the control gate and the item of data is de facto written with the numerical value during the putting into conduction of the cell. The programming is then stopped.

20 Claims, 12 Drawing Sheets

(56) References Cited

U.S. PATENT DOCUMENTS

| | | |
|---|---|---|
| 6,040,993 A | 3/2000 | Chen et al. |
| 6,044,015 A | 3/2000 | Van Houdt et al. |
| 6,058,060 A | 5/2000 | Wong |
| 6,101,121 A | 8/2000 | Rolandi |
| 6,151,246 A | 11/2000 | So et al. |
| 6,154,392 A | 11/2000 | Patti |
| 6,233,175 B1 | 5/2001 | Wang et al. |
| 6,426,893 B1 | 7/2002 | Conley et al. |
| 6,522,584 B1 | 2/2003 | Chen et al. |
| 6,576,517 B1 | 6/2003 | Patclmo et al. |
| 6,630,709 B2 | 10/2003 | Chang et al. |
| 7,259,993 B2 | 8/2007 | Redaelli et al. |
| 7,317,637 B2 | 1/2008 | Confalonieri et al. |
| 7,864,585 B2 | 1/2011 | Tamada |
| 2005/0116262 A1 | 6/2005 | Chen et al. |
| 2006/0200619 A1* | 9/2006 | Kunori ............... G11C 11/5621 711/103 |
| 2006/0273404 A1 | 12/2006 | Scheuerlein |
| 2007/0291543 A1 | 12/2007 | Mokhlesi |

* cited by examiner

METHOD FOR WRITING INTO AND READING A MULTI-LEVELS EEPROM AND CORRESPONDING MEMORY DEVICE

CROSS-REFERENCE TO RELATED APPLICATIONS

This application is a divisional of U.S. patent application Ser. No. 14/511,661, entitled "METHOD FOR WRITING INTO AND READING A MULTI-LEVELS EEPROM AND CORRESPONDING MEMORY DEVICE," filed on Oct. 10, 2014, which claims the benefit of French application number 1360418, filed on Oct. 25, 2013, which applications are hereby incorporated herein by reference.

TECHNICAL FIELD

The present invention relates generally to memories, and, in particular embodiments, to a method for writing into and reading a multi-levels EEPROM and corresponding memory device.

BACKGROUND

A memory cell of the EEPROM type generally comprises a transistor having a floating gate allowing the storage of the item of data, a control gate, a source region and a drain region. Such a memory cell uses the principle of the non-volatile storage of charges on the floating gate of the transistor. Conventionally, the writing of an item of data comprises an erase cycle followed by a programming cycle.

The programming is carried out by the Fowler-Nordheim effect and comprises the injection by tunnel effect of electrons from the floating gate towards the drain whilst the erasing, which is also carried out by the Fowler-Nordheim effect, comprises an injection by tunnel effect of electrons from the drain towards the floating gate.

Conventionally, the programming of a memory cell of the EEPROM type is carried out by connecting the control gate to ground and by applying a relatively high programming voltage to the drain, typically 13 Volt. Moreover, with regard to the source, there are two possibilities: either the source is left floating or it is pre-charged at a non-zero pre-charge voltage.

In the first case (source left floating), the potential of the source rises during the programming, the floating gate is charged positively and the memory cell goes, at the end of the programming, into a conducting state but does not conduct because, as the source is floating, it presents infinite impedance.

In the second case (pre-charging the source), the floating gate is also charged positively during the programming but the cell does not go into a conducting state because the pre-charge voltage of the source is chosen such that the difference between the potential of the floating gate and the potential of the source always remains below the threshold voltage of the transistor of the memory cell.

Thus, in all cases, the memory cell does not go into conduction during the programming.

Moreover, the write cycle (erasure and then programming) is of fixed duration, typically 4 ms, which can result in over-programmings, that is to say in quantities of charge uselessly stored on the floating gate that are too large, which has a negative impact on the lifetime of the memory cell, as well as in a dispersion of the conduction thresholds of different programmed memory cells.

SUMMARY

Implementations and embodiments of the invention relate to memories that are programmable and erasable by the Fowler-Nordheim effect such as electrically erasable programmable read-only memories, referred to as EEPROM memories, and more particularly multi-level memories, that is to say capable of storing several bits per memory cell or memory element.

According to one implementation, there is proposed a method of programming a memory call of the type that is programmable by the Fowler-Nordheim effect, for example, aimed at avoiding such over programmings and making it possible to reduce the average charge passing through a cell during an erase-programming cycle.

According to one implementation, it is proposed to apply such a method in order to be able to very simply store an item of data in a memory cell of this type, the item of data being able to have more than three different numerical values, which then makes it possible to obtain a multi-level memory call, for example of the EEPROM type.

According to one implementation, it is thus proposed to control, during the programming and in real time, the charge stored on the floating gate of an EEPROM cell for example, and to do so without interrupting the programming.

Thus, according to one implementation, the final threshold voltage (final conduction threshold) of an EEPROM cell is controlled at the end of a programming cycle by acting on the voltage level applied to the control gate. In fact, this results from the observation that there is a biunivocal relationship between this control gate voltage and this conduction threshold making it possible, for a target conduction threshold, to define the voltage to be applied to the control gate. Moreover, if a numerical value of the item of data is associated with a target conduction threshold, it is then possible to determine the voltage to be applied to the control gate so that, at the end of the programming, the floating gate is de facto charged with the quantity of charge corresponding to that target conduction threshold, the memory cell then de facto being written with the numerical value of the item of data corresponding to that target threshold.

According to one aspect there is proposed a method for writing an item of data in at least one memory cell, the memory cell being programmable by the Fowler-Nordheim effect and comprising a transistor having a floating gate, a control gate, a source region and a drain region.

According to a general feature of this aspect, during a phase of programming the cell, a first voltage is applied to the source region, a second voltage, higher than the first voltage, is applied to the drain region until the cell is put into conduction. The numerical value of the item of data to be written is controlled by the level of the control voltage applied to the control gate and the item of data being de facto written with the numerical value during the putting into conduction of the cell. The programming is then stopped.

Such a method is therefore distinguished from the conventional programming of an EEPROM cell in which the memory cell never goes into conduction.

In this case, on the contrary, the memory cell, initially not conducting, goes into conduction and the programming is then stopped, the cell then having a desired conduction threshold associated with a numerical value of the item of data and corresponding to the value (level) of the control voltage that was applied to the control gate.

Even though the source region can be connected to ground as a first voltage during the programming phase, it is also possible to apply, during the programming phase, a non-zero voltage to the source region, provided that this first voltage remains lower than the second voltage applied to the drain region. It is thus possible to bias the source at 6 Volt, the source/drain potential difference at the end of the programming then being reduced by the value of the source voltage. Moreover, when the cell becomes conductive and goes into conduction, the drain voltage no longer drops to 0 Volt but to 6 Volt which is sufficient to stop any injection of carriers by the Fowler-Nordheim effect. The conduction threshold will then be shifted by the source voltage to which the substrate effect is added.

Applying a non-zero voltage to the source region during the programming can thus result in obtaining a better endurance of the cell because of a weaker transverse electric field in the channel.

According to one implementation, when the item of data is capable of taking n different numerical values, a set of at least n−1 different programming values is defined for the control voltage to be applied to the control gate of the transistor during the programming phase and respectively corresponding to at least n−1 different conduction thresholds of the cell respectively associated with at least n−1 different numerical values of the item of data, and during the programming phase the control voltage having the programming value corresponding to the desired numerical value of the item of data is applied to the control gate.

The method according to this aspect has advantages even when n is equal to 2, that is to say when the item of data comprises one bit capable of taking two values 0 or 1. In fact, such a method making it possible to control the charge stored on the floating gate in situ and in real time during the programming notably prevents over-programming, which can improve the endurance of the cell.

This being so, the method according to this aspect makes it possible to program a memory cell very simply with an item of data that can take at least three different numerical values.

In other words, this very simply produces a multi-level memory that is to say one capable of storing an item of data having several bits, that can be programmed without having recourse to interactive programming and reading algorithms of the prior art that are complex of costly in terms of duration, used in multi-level FLASH memories which are typically memories programmable by hot electrons necessitating conduction of the cell in order to allow the injection of the hot electrons in the floating gate, contrary to programming by the Fowler-Nordheim effect.

When the memory cell is also erasable by the Fowler-Nordheim effect, which is the case of a memory cell of the EEPROM type, the writing method according to one implementation comprises an erase cycle of the at least one memory cell, preceding the programming phase and during which the drain and the source of the transistor are coupled to ground and a control voltage having an erase value is applied to the control gate, which makes it possible to give the cell a first conduction threshold.

Moreover, a first numerical value of the item of data is advantageously associated with this first conduction threshold which then makes it possible to define only a set of n−1 different programming values for the control voltage to apply to the control gate of the transistor during the programming phase and corresponding respectively to n−1 other different conduction thresholds of the cell respectively associated with the n−1 other different numerical values of the item of data.

Moreover, during the programming phase, there is applied to the control gate the control voltage having the programming value corresponding to the desired numerical value of the item of data taken from among the n−1 other numerical values of the item of data.

At least some of the programming values can be negative.

There are several ways of stopping the programming when the memory cell is put into conduction.

According to one implementation, it is possible to apply the second voltage to the drain of the transistor with a voltage generator whose current is limited to the current consumed by the cell put into conduction. The programming is then stopped by itself when the cell is put into conduction since the consumption of that cell makes the drain voltage drop, which naturally stops the programming.

According to another possible implementation, it is possible to apply the second voltage to the drain of the transistor with a voltage generator having no current limitation but the value of the current consumed by the cell is then measured, for example by a readback of the current flowing in the bit line and when that current exceeds a threshold the high voltage generator is deactivated in order to stop the programming.

When there is a memory plane containing memory cells for example organized in lines and columns, the method comprises, according to an implementation, a selection of at least one group of several memory cells of the memory plane, for example a page or byte depending on a granularity, and respective data writings in the memory cells of the at least one group, each item of data being able to take n different numerical values, n being greater than or equal to 2 and advantageously greater than or equal to 3.

According to one implementation, in which data of different numerical values are intended to be written in different memory cells of the at least one group, the erase cycle is applied to all of the memory cells of the at least one group in order to give them the first conduction threshold corresponding to the first numerical value. Then, from among the erased memory cells, there is selected a sub group of rank 1 comprising the memory cells of the at least one group which must be written with a second numerical value corresponding to a second conduction threshold that is lower than the first conduction threshold. The programming phase comprises a first programming cycle during which there is applied, to the control gates of the memory cells of the sub group of rank one, the control voltage having the programming value associated with the second conduction threshold.

Then there is possibly selected from among the written memory cells of the sub-group of rank i, where i is greater than or equal to 1, a sub group of rank i+1 comprising the memory cells of the at least one group which must be written with a numerical value corresponding to another conduction threshold, lower than the conduction threshold of the cells of the sub group of rank i. The programming phase comprises an i+1th programming cycle during which there is applied to the control gates of the memory cells of the sub-group of rank i+1 the control voltage having the programming value associated with the other conduction threshold. Then the steps a) are possibly repeated until there is a programming of possible memory cells of the at least one group having to be written with a numerical value corresponding to the lowest conduction threshold.

According to another aspect, there is proposed a method of reading an item of data written in a memory cell by the writing method defined above and capable of having n different numerical values corresponding respectively to n different conduction thresholds of the cell.

The method according to this aspect then comprises, for example, a generation of a set of at least n−1 reference values for the read voltage to be applied to the control gate of the transistor during a read cycle, the n−1 reference values being respectively situated between the n conduction thresholds, an application of a third voltage to the drain, and an application to the control gate of a read voltage having the lowest reference value, and if the cell is cut off, a repetition of step a) with the reference value adjacent to the previously applied reference value until a conducting cell is obtained or until all of the reference values have been exhausted.

According to another aspect, there is proposed a device comprising at least one memory cell programmable by the Fowler Nordheim effect having a transistor having a floating gate, a control gate, a source region and a drain region, and write circuitry (or a write circuit) configured to write the memory cell with an item of data.

According to a general feature of this aspect, the write circuitry comprises a programming circuit configured to apply a first voltage to the source region, control the numerical value of the item of data to be written by the voltage level applied to the control gate, apply to the drain region a second voltage, higher than the first voltage, until the cell is put into conduction, the item of data being de facto written when the cell is put into conduction with the numerical value corresponding to the control voltage level applied, and stop the programming once the cell has been put into conduction.

The programming circuit can be configured to apply ground as the first voltage to the source region, or to apply a non-zero first voltage to this source region.

According to an embodiment in which the item of data is able to take n different numerical values, n being for example greater than or equal to 3, the write circuitry comprises a generation circuit configured to generate a set of at least n−1 different programming values for the control voltage corresponding respectively to at least n−1 different conduction thresholds of the cell respectively associated with at least n−1 different numerical values of the item of data, and the programming circuit is configured to apply to the control gate of the transistor the control voltage having the programming value corresponding to the desired numerical value of the item of data.

According to an embodiment in which the cell is erasable by the Fowler-Nordheim effect, the generation circuit is configured to generate a set of n values for the control voltage comprising an erase value corresponding to a first conduction threshold of the cell associated with a first numerical value of the item of data and n−1 different programming values corresponding respectively to n−1 other different conduction thresholds of the cell associated respectively with the n−1 other different numerical values of the item of data, and the write circuitry furthermore comprises an erase circuit configured to couple the drain and the source of the transistor to ground and to apply to the control gate a control voltage having the erase value, and the programming circuit is configured to apply to the control gate of the transistor the control voltage having the programming value corresponding to the desired numerical value of the item of data and taken from among the n−1 different programming values of the set.

According to one embodiment, the programming circuit comprises a voltage generator with current limited to the value of the current of the cell put into conduction, configured to apply the second voltage to the drain of the transistor.

As a variant, the programming circuit can comprise a voltage generator configured to apply the second voltage to the drain of the transistor, a measuring circuit configured to measure the value of the current consumed by the cell, a comparator configured to compare the value of the current consumed with a threshold and to deliver a control signal if the value of the current consumed exceeds the threshold, and a control circuit configured to deactivate the voltage generator in the presence of the control signal.

According to one embodiment, the device comprises a memory plane comprising several memory cells and the write circuitry is configured to select at least one group of memory cells and to write items of data respectively in the memory cells of the group, each item of data being able to take n different numerical values.

According to one embodiment in which the items of data of different numerical values are intended to be written in different memory cells of the at least one group, the erase circuit is configured to give all of the memory cells of the at least one group the first conduction threshold corresponding to the first numerical value, and the programming circuit is configured to select from among the erased memory cells, a sub-set of rank 1 of memory cells of the at least one group which must be written with a second numerical value corresponding to a second conduction threshold lower than the first conduction threshold and to apply, to the control gates of the memory cells of the sub group of rank one, the control voltage having the programming value associated with the second conduction threshold, then, a) possibly select from among the written memory cells of the sub group of rank i, a sub group of rank i−1 of memory cells of the at least one group which must be written with a numerical value corresponding to another conduction threshold lower than the conduction threshold of the cells of the sub-group of rank i and apply to the control gates of the memory cells of the sub-group of rank i+1 a control voltage having the programming value associated with the other conduction threshold, and possibly repeat the steps a) up to the possible memory cells having to be written with a numerical value corresponding to the lowest conduction threshold.

According to one embodiment, the device furthermore comprises a read circuit configured to read from at least one memory cell an item of data able to take n different numerical values corresponding respectively to n different conduction thresholds of the cell, the read circuit being configured to apply a third voltage to the drain, apply to the control gate a read voltage having the lowest reference value taken from among a set of at least n−1 reference values, the n−1 reference values being respectively situated between the n conduction thresholds, and if the cell is cut off, repeating step a) with the reference value adjacent to the one previously applied until a conducting cell is obtained or until all of the reference values have been exhausted.

According to one embodiment, the read circuit is configured to select at least one set of memory cells and to read respectively the items of data in the memory cells of the set, each item of data read being able to take n different numerical values.

BRIEF DESCRIPTION OF THE DRAWINGS

Other advantages and features of the invention will become apparent on examination of the detailed description of implementations and embodiments that are in no way limiting and of the appended drawings in which.

DETAILED DESCRIPTION OF ILLUSTRATIVE EMBODIMENTS

Figure 1:
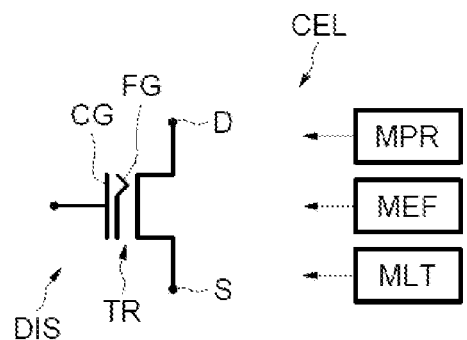
FIGS. 1 to 14 are diagrammatic illustrations of different implementations and embodiments of write methods and of read methods according to the invention and of a memory device according to the invention.

In FIG. 1, the memory device DIS here comprises a memory cell CEL, for example a memory cell of the EEPROM type, comprising a transistor TR having in conventional manner a control gate CG, a floating gate FG, a drain region D and a source region S.

The device DIS also comprises a programming circuit MPR intended for, as will be seen in detail below, applying appropriate voltages to the drain, source and control gate regions.

The device DIS also comprises an erase circuit MEF intended to place the memory cell CEL in an erased state as well as a read circuit MLT configured to read the item of data written in memory cell CEL.

The read conduction threshold, or more simply the conduction threshold, of the cell CEL is the voltage $V_t$ that must be applied during reading to the control gate in order to make the cell conduct. This conduction threshold $V_t$ is defined by the following formula (1):

$$A \cdot V_t + B \cdot V_{dr} + Q/C_{tot} = V_{t0} + V_S \quad (1)$$

in which $V_{dr}$ denotes the voltage applied to the drain during reading, $V_{t0}$ is the threshold voltage of the state transistor of the cell, that is to say the buried transistor, seen from the floating gate, Q denotes the charge stored on the floating gate (typically Q is negative for an erased cell, zero for a blank cell and positive for a programmed cell), $C_{tot}$ is the total capacitance seen from the floating gate (floating gate capacitively coupled with the control gate, the drain, the channel, the source and the substrate), $A=C1/C_{tot}$ where C1 denotes the coupling capacitance between the control gate and the floating gate, $B=C2/C_{tot}$ where C2 denotes the coupling capacitance between the floating gate and the drain, $V_S$ denotes the voltage applied to the source region.

Typically, for a cell of the EEPROM type, A varies from 0.6 to 0.75 and B varies from 0.2 to 0.3 depending on the embodiment of the cell.

The charge Q is therefore defined by the following formula (2):

$$Q = [V_{t0} + V_S - A \cdot V_t - B \cdot V_{dr}] \cdot C_{tot} \quad (2)$$

For a given charge Q, the stopping of the programming occurs when the voltage $V_{FG}$ on the floating gate is equal to $V_{t0} + V_S$ which is then represented by the following equation (3):

$$A \cdot V_{CG} + B \cdot V_d + Q/C_{tot} = V_{t0} + V_S \quad (3)$$

in which $V_{CG}$ denotes the voltage applied to the control gate during programming, $V_d$ denotes the voltage applied to the drain during programming.

Considering the equation (2), the following equation (4) is therefore obtained $$A \cdot [V_{CG} - V_t] + B \cdot [V_d - V_{dr}] = V_S \quad (4)$$

As the programming is stopped during injection, the voltage $V_{FG}$ is equal to $(V_{t0}+V_S)$, and $(V_d - V_{FG})$ is substantially equal to $V_{FN}$ where $V_{FN}$ denotes the Fowler-Nordheim injection voltage.

When the programming is stopped, the following equation (5) is therefore obtained:

$$V_d = V_{FN} + V_{t0} + V_S \quad (5)$$

Combining the equations (4) and (5) then provides the following equation (6):

$$V_{CG} = V_t + [B/A] \cdot [V_{dr} - V_{FN} - V_{t0} + V_S(1 - B/A)] \quad (6)$$

Moreover, making the hypothesis that the voltage $V_{dr}$ is substantially equal to the voltage $V_{t0}$, which is typically the case, the following equation (7) is then obtained.

$$V_{CG} = V_t - [B/A] \cdot V_{FN} + V_S(1 - B/A) \quad (7)$$

This formula (7) biunivocally determines the voltage $V_{CG}$ to be applied to the control gate of the transistor TR at the time when the cell begins to conduct in order to obtain a final threshold voltage (final conduction threshold) of the cell equal to $V_t$.

Thus, if the programming of a cell is stopped when it is put into conduction, the value $V_{CG}$ makes it possible to control the conduction threshold of a cell having undergone a programming cycle.

In other words, it has been shown that there is a unique relationship between the voltage to be applied to the control gate and the conduction threshold of the cell, which makes it possible, for a target conduction threshold, to define the value of the voltage to be applied to the control gate in order to reach this target conduction threshold.

Moreover, if this target conduction threshold is associated with a numerical value of the item of data to be written, it is therefore possible to associate this numerical value of the item of data with a voltage to be applied to the control gate.

In other words, during the phase of programming the cell, a voltage is applied to the drain region that is higher than the voltage applied to the source region until the cell is put into conduction, the numerical value of the item of data to be written being controlled by the level of the control voltage applied to the control gate and this item of data is de facto written with the numerical value when the cell is put into conduction, the programming then being stopped.

It is thus easy to store in the memory cell numerical items of data able to take several different numerical values, for example items of data encoded in two or more bits, simply by controlling the charge injected in real time into the cell by application to the control gate of a voltage corresponding to the conduction threshold of the cell associated with the numerical value desired for the item of data. No iterative algorithms with successions of programming and reading are therefore used. There is no impact on the programming time.

Such a method does not necessitate a complex machine and, for a memory plane whose cells are capable of storing two bits corresponding to four charge level domains, a doubling of the density is obtained for the same area of the memory plane.

Figure 2:
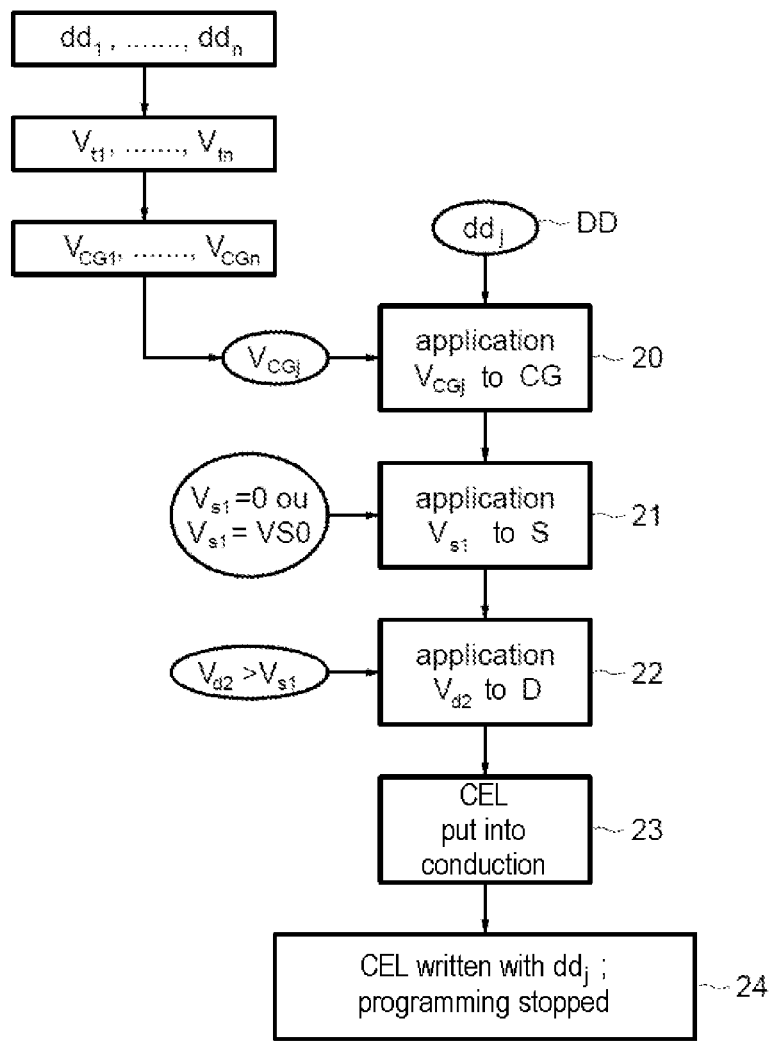

An example of such a programming is shown in greater detail in FIG. 2.

Thus, for an item of data DD able to take n different numerical values $dd_1$-$dd_n$, n conduction thresholds $V_{t1}$-$V_{tn}$ are defined for the cell, respectively corresponding to the n numerical values $dd_i$ of the item of data DD to be written. It is then possible to define n values $V_{CGi}$ for the voltage applied to the control gate during the programming, each of these values $V_{CGi}$ corresponding to the conduction threshold $V_{ti}$ and therefore to the numerical value $dd_i$ of the item of data DD to be written.

This being so, as will be seen in greater detail below, it is possible to define only n−1 values of voltage to be applied to the control gate during the programming and to use a voltage applied to the control gate during the erasing of the cell in order to define a conduction threshold that corresponds to one of the possible numerical values of the item of data DD.

If it is desired to write the item of data DD with the numerical value $dd_j$, then the corresponding voltage $V_{CGj}$ is applied (step 20) to the control gate CG. Moreover the voltage $V_{s1}$ is applied to the source region S of the transistor TR of the cell (step 21). This value $V_{s1}$ can be equal to zero (source connected to ground) or equal to a non-zero voltage $V_{S0}$.

Moreover, a second voltage $V_{d2}$ is applied to the drain D of the transistor (step 22), this voltage $V_{d2}$ being higher than the voltage $V_{s1}$ applied to the source in order to be able to put the cell CEL into conduction.

Moreover, when this cell is effectively put into conduction (step 23), the programming is then stopped, the cell CEL de facto containing on its floating gate the corresponding charge Q, the cell CEL therefore being de facto written with the item of data DD having the numerical value $dd_j$ corresponding to the value $V_{CGj}$ of the programming voltage applied to the control gate CG.

There are several possible ways of stopping the programming of the cell when it is put into conduction.

Figure 3:
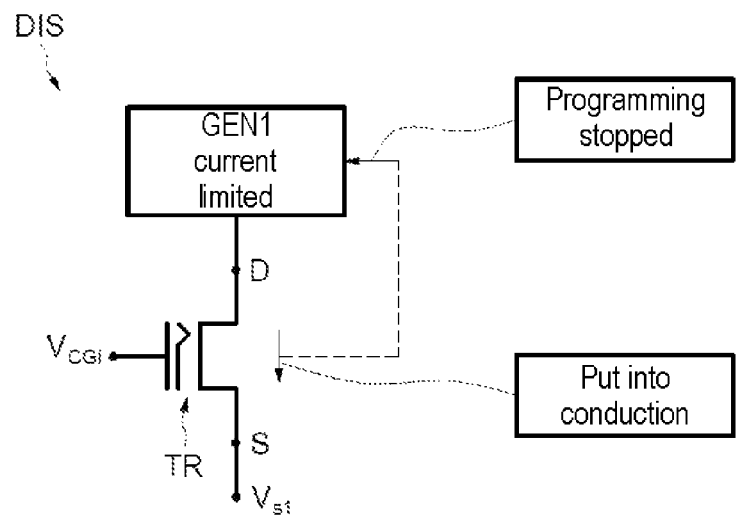
Figure 4:
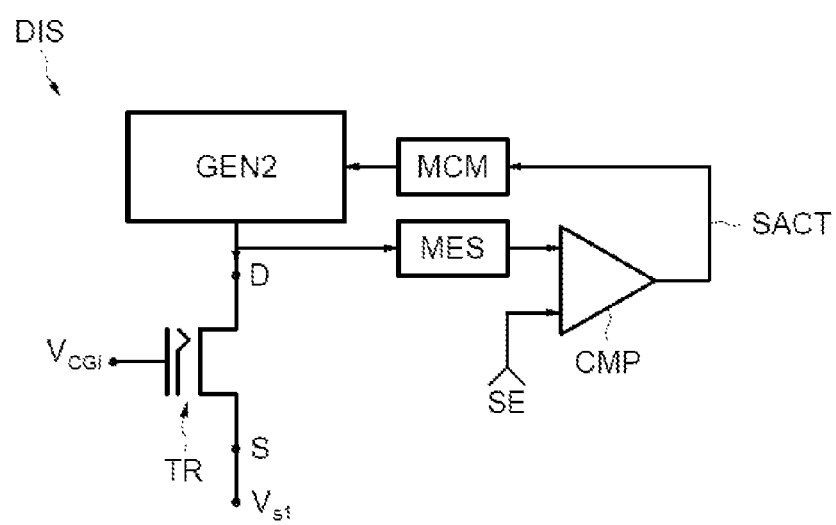

Two of these are shown diagrammatically in FIGS. 3 and 4.

More precisely, in FIG. 3, the voltage $V_{d2}$ applied to the drain D of the transistor TR during the programming is provided by a voltage generator GEM limited in current to the value of the current consumed by the cell when the latter is conducting, for example 10 nanoamps.

Consequently, as shown in FIG. 3, during the putting into conduction, the programming of the cell is automatically stopped by the drop in the drain voltage towards the source voltage.

The other way, illustrated in FIG. 4, uses for applying the voltage to the drain D, a voltage generator GEN2 that is not current limited. On the contrary, the device DIS then comprises a measuring circuit MES configured to measure the current consumed by the cell. A comparator CMP compares the measured current value with a threshold SE, typically 10 nanoamps. The output of the comparator CMP delivers a control signal SACT to the control circuit MCM which are configured to deactivate or not the generator GEN2. More precisely, when the value of the current consumed by the cell, that is to say the value of the bit lines current, exceeds the threshold SE, this signifies a putting into conduction of the cell CEL and the control circuit then deactivates the generator GEN2 in order to stop the programming.

The cell CEL can also be erased by the Fowler-Nordheim effect. The writing of an item of data in such a cell, for example of the EEPROM type, comprises an erase cycle preceding the programming phase.

Figure 5:
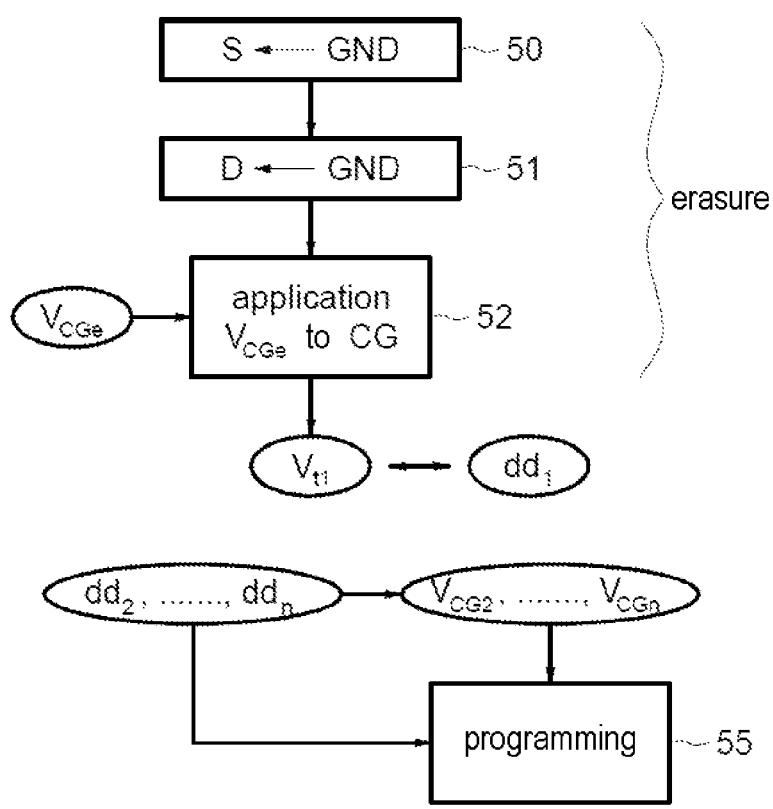

This conventional erase cycle is shown in FIG. 5. More precisely, the erase circuit MEF is configured to couple the drain and the source of the transistor to ground (steps 50 and 51), and to apply to the control gate (step 52) a control voltage having an erase value VCGe, typically 13 volts.

Moreover, at the end of this programming cycle, the cell CEL has a first conduction threshold Vt1 which can then be associated with a first numerical value dd1 of the item of data DD.

In these conditions, it is then only necessary to define n−1 different programming values $V_{CG2}$-$V_{CGn}$ for the control voltage to be applied to the control gate of the transistor during the programming phase 55, these n−1 different programming values corresponding respectively to n−1 other different conduction thresholds of the cell associated respectively with the other n−1 different numerical values $dd_2$-$dd_n$ of the item of data DD.

Figure 6:
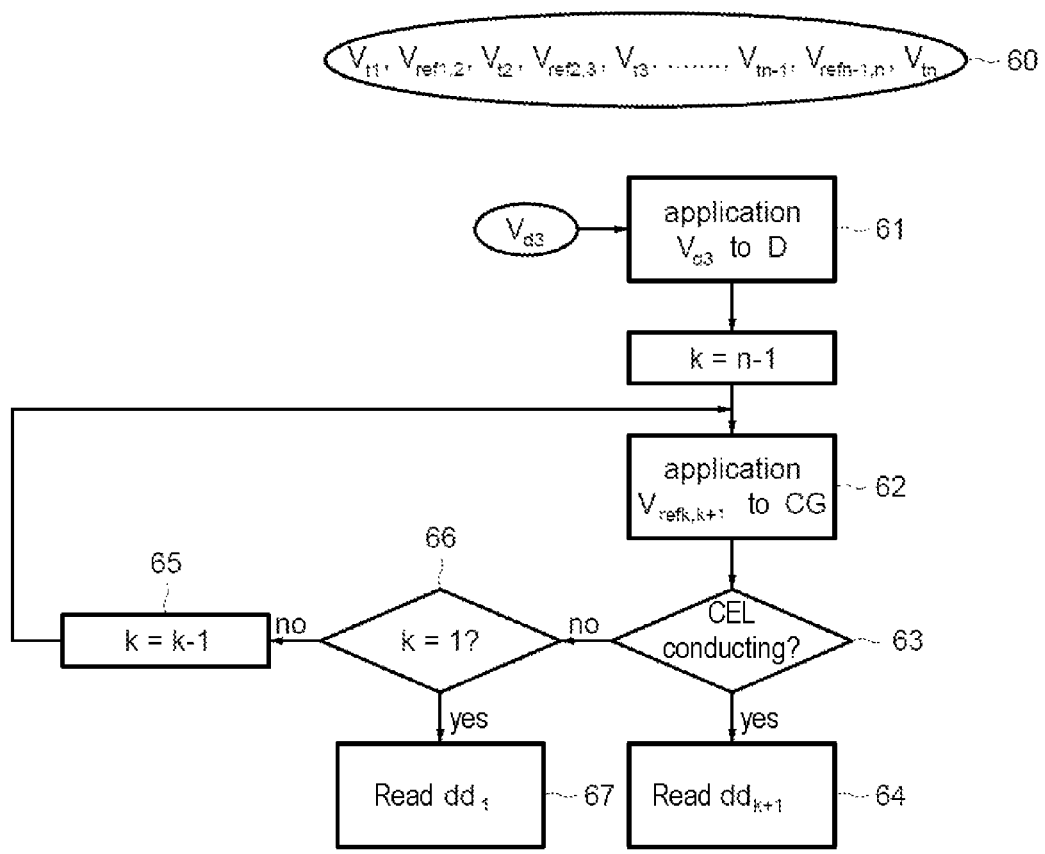

FIG. 6 is a diagrammatic illustration of an implementation of the method of reading an item of data DD written in the memory cell CEL, this item of data DD being able to have n different numerical values respectively corresponding to n different conduction thresholds $V_{t1}$-$V_{tn}$ of the cell.

In this respect, there is generated (step 60) a set of at least n−1 reference values $V_{refk,k+1}$ for the read voltage to be applied to the control gate of the transistor during a read cycle, k varying from 1 to n−1.

These n−1 reference values $V_{refk,k+1}$ are respectively situated between the n conduction thresholds $V_{tk}$ and $V_{tk+1}$.

Preferably, for each reference value situated between two conduction threshold values, a reference value that is sufficiently distant from the corresponding thresholds will be chosen, for example situated in the middle of the interval.

During this read cycle, a voltage $V_{d3}$ is applied (step 61) to the drain D of the transistor, typically of the order of 1 volt, the source is coupled to ground and a read voltage having a reference value $V_{refk,k+1}$ taken from among the set of reference values is applied to the control gate (step 62). In practice, the lowest reference value (k=n−1) will be applied firstly, that is to say $V_{refn-1,n}$.

Then it is tested (step 63) if the cell CEL is conducting or not.

If the cell is conducting, then this signifies (step 64) that the cell was written with the value $dd_{k+1}$ corresponding to the conduction threshold $V_{tk+1}$.

In the opposite case, that is to say if the cell is cut off, steps 62 and 63 are repeated with another reference value taken from among the set of reference values until a conducting cell is obtained.

In practice, the increasing read voltages will be applied to the control gate CG in the decreasing order of their rank (decrementation of k: step 65).

Moreover if, during the application of a read voltage having the first highest reference value $V_{ref1,2}$, the cell is still cut off (steps 63 and 66) this signifies that the cell was written with the numerical value $dd_1$ corresponding to the last highest conduction threshold $V_{t1}$.

Although this is possible, it is in fact not necessary in practice to apply a read voltage higher than the last conduction threshold $V_{t1}$ to the control gate of the cell CEL in order to ensure that the cell is then fully conducting.

Figure 7:
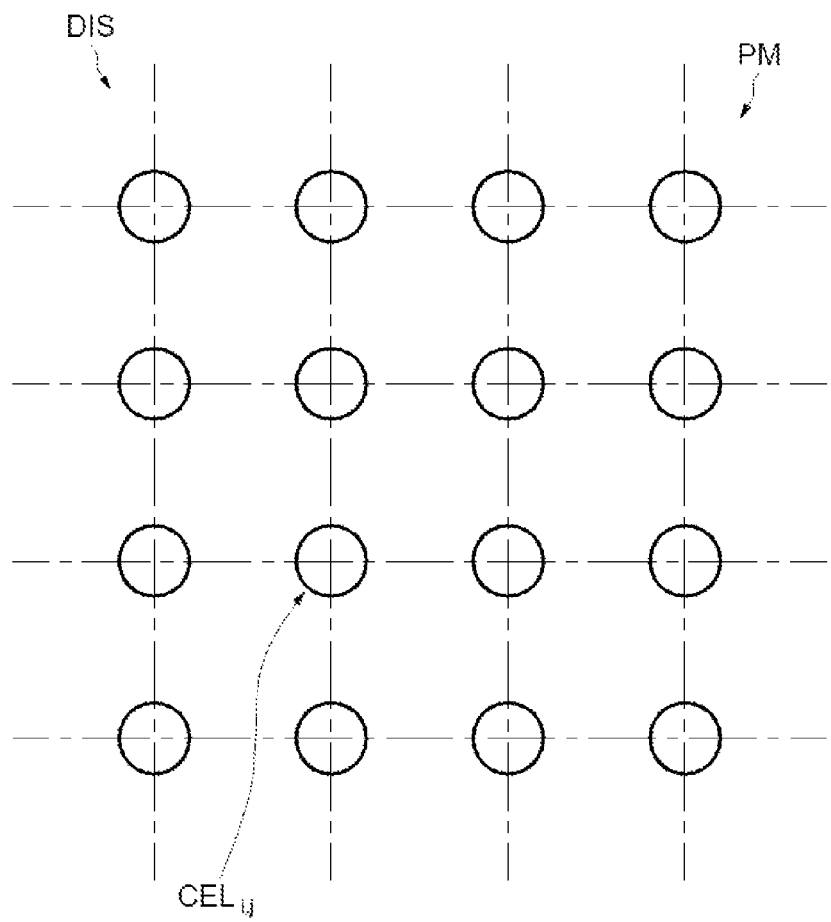

In the embodiment shown in FIG. 7, the device DIS this time comprises a memory plane PM of cells $CEL_{i,j}$, organized in lines and columns.

It is also assumed in this embodiment that each item of data DD to be written in a memory cell $CEL_{i,j}$ is encoded in two bits, that is to say that it is capable of taking four different numerical values $dd_1$-$dd_4$, for example the values 00, 01, 10 and 11.

It is also assumed in this embodiment, by way of example, that among all the memory cells of the memory plane, the cells $CEL_{g1}$ belonging to a first group de memory cells are intended to be written with the numerical value $dd_1$ (00).

The memory cells $CEL_{g2}$ of a second group are intended to be written with the numerical value $dd_2$ (01).

The cells $CEL_{g3}$ of a third group are intended to be written with the numerical value $dd_3$ (1,0).

The cells $CEL_{g4}$ of a fourth group are intended to be written with the numerical value $dd_4$ (1,1).

Moreover, by way of example, four target conduction thresholds $V_{t1}$-$V_{t4}$ corresponding respectively to the four numerical values $dd_1$-$dd_4$ are defined.

More precisely, by way of example, the values of these conduction thresholds $V_{t1}$-$V_{t4}$ are fixed at 2.9 volts, 1.6 volt, 0.3 volt and −1 volt respectively If, by way of example, it is considered that the value $V_{FN}$ of the Fowler-Nordheim voltage is equal to 9 volts, $V_{t0}$ is equal to $V_{dr}$ and to 0.9 volt, A is equal to 0.7 whilst B is equal to 0.25, then from this it is derived, taking account of the above equation (7), that the programming value $V_{CG}$ of the voltage to be applied to the control gate during the programming phase is then defined by the following formula (8):

$$V_{CG} = V_t - 3.2 \text{ volts} \tag{8}$$

The four programming values $V_{CG1}$-$V_{CG4}$ corresponding respectively to the four target conduction thresholds mentioned above and respectively associated with the four numerical values $dd_1$-$dd_4$ of the item of data DD are then as follows:

Value $dd_1$ (00): $V_{CG1}$=−0.3 volt,
Value $dd_2$ (01): $V_{CG2}$=−1.6 volt,
Value $dd_3$ (10): $V_{CG3}$=−2.9 volts,
Value $dd_4$ (11): $V_{CG4}$=−4.2 volts.

In fact, as will now be seen in greater detail, the value $V_{CG1}$ is in fact useless because the first conduction threshold will be obtained at the end of the erase cycle.

Figure 8:
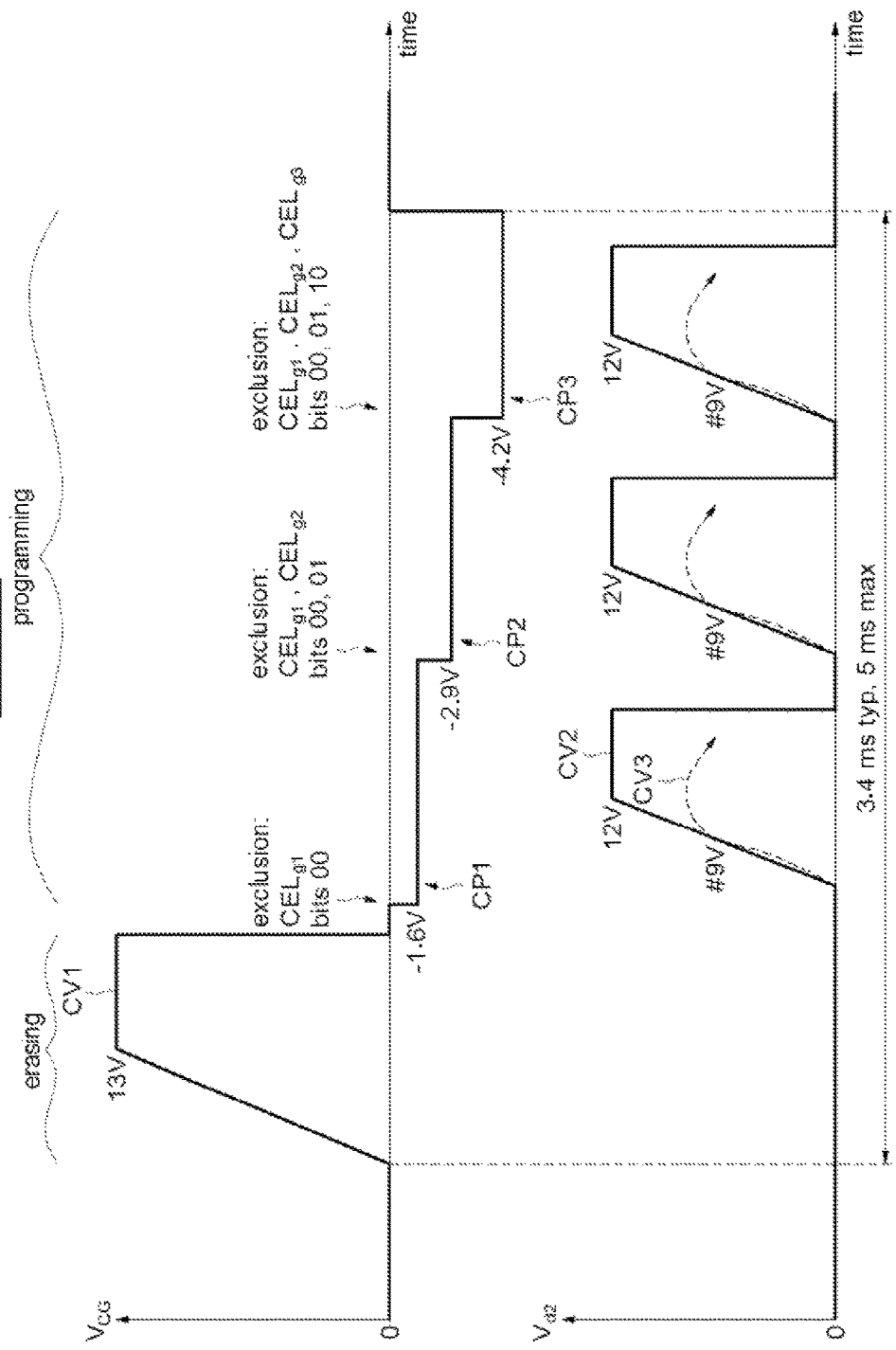

In this respect, reference will now be made more particularly to FIG. 8.

In this figure, the curve CV1 shows the variation of the voltage $V_{CG}$ applied to the control gate of the different cells during the write cycle (erasing then programming).

The curve CV2 shows the corresponding variation of the drain voltage upstream of a current limiter associated with the generator delivering this voltage whilst the curve CV3 shows the drain voltage downstream of this current limiter.

Firstly, the erase circuit executes an erase cycle bringing all the cells of the four groups $CEL_{g1}$, $CEL_{g2}$, $CEL_{g3}$ and $CEL_{g4}$ to the conduction threshold $V_{t1}$ (2.9 Volts). Consequently, all of the numerical values (00, 01, 10, 11) are involved here.

During this erase cycle, the erase circuit applies a gradient rising from 0 to 13 volts in 0.5 milliseconds to the control gate, for example, followed by a level section at 13 volts for a duration of 0.5 milliseconds. The erase circuit also couples the drain and the source to ground.

The programming phase will then comprise three successive programming cycles CP1, CP2 and CP3.

During the first programming cycle CP1, the programming circuit selects only cells $CEL_{g2}$, $CEL_{g3}$ and $CEL_{g4}$ by excluding the cells of the first group $CEL_{g1}$ which have to be programmed only with the numerical value 00.

During this first programming cycle, the programming value $V_{CG2}$=−1.6 volt is applied to the control gate of the transistors of the selected cells.

The programming circuit moreover applies, before current limitation, a voltage $V_{d2}$ to the drain in the form of a gradient rising from 0 to 12 volts in 0.4 milliseconds followed by a level section of 0.4 milliseconds. Taking account of the current limitation, the voltage on the drain is limited to 9 volts and then drops during the putting into conduction of the cells, which causes, as explained above, the stopping of the programming.

At the end of this first programming cycle, all of the cells $CEL_{g2}$, $CEL_{g3}$ and $CEL_{g4}$ finish with a conduction threshold of 1.6 volts.

During the second programming cycle CP2, this time it is the cells $CEL_{g1}$ and $CEL_{g2}$ that are excluded from the programming and only the cells $CEL_{g3}$ and $CEL_{g4}$ are selected.

During this second programming cycle CP2, the programming value $V_{CG2}$, equal to −2.9 volts, is applied to the control gates of the selected cells whilst the programming circuit applies, during this cycle, a voltage $V_{d2}$ to the drain, equivalent to the one applied during the first programming cycle.

At the end of this second programming cycle, the cells $CEL_{g3}$ and $CEL_{g4}$ finish with a conduction threshold equal to 0.3 volt.

During the third programming cycle CP3, this time it is the cells $CEL_{g1}$, $CEL_{g2}$ and $CEL_{g3}$ that are excluded from the programming, and only the cells $CEL_{g4}$ are selected.

Here again, the voltage applied to the drain is identical to that applied during the preceding two programming cycles. On the contrary, during this third programming cycle CP3, the reference value $V_{CG4}$, equal to −4.2 volts is applied to the control gates of the selected cells.

Moreover, at the end of this third programming cycle, the cells $CEL_{g4}$ finish with a conduction threshold of −1 volt.

Thus, at the end of these three programming cycles, the cells $CEL_{g1}$ have been programmed with the value 00, the cells $CEL_{g2}$ have been programmed with the value 01, the cells $CEL_{g3}$ have been programmed with the value 10 and the cells $CEL_{g4}$ have been programmed with the value 11.

Figure 9:
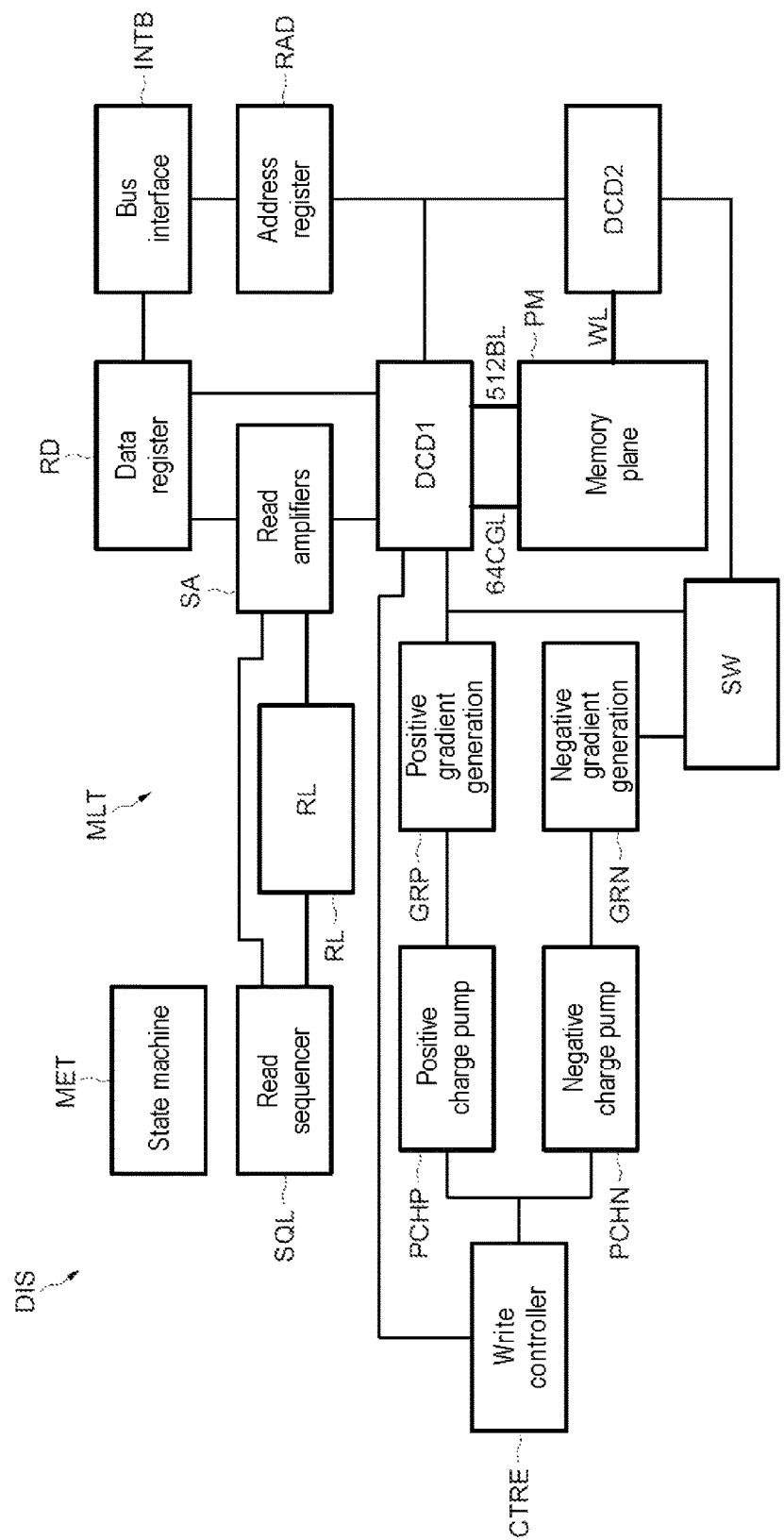

Reference will now be made more particularly to FIG. 9 in order to describe an embodiment of a device according to the invention applicable to a memory plane of the EEPROM type having 512 lines and 512 columns with a granularity of the byte type.

Taking account of this "byte" granularity, the memory cells of a same line can be "grouped" in blocks of 8 and the 512 homologous blocks situated respectively on the 512 lines share the same line CGL connected to all of these cells. There are therefore 64 lines CGL for 512 bit lines BL and 512 word lines WL.

Moreover, in the continuation of the description the term "column" will globally denote a block of 8 bit lines.

The erase circuit MEF comprises positive charge pump PCHP, of conventional structure and known per se, followed by a positive gradient generation circuit GRP.

The programming circuit MPR comprises a negative charge pump PCHN of conventional structure and known per se, followed by a negative gradient generation circuit GRN.

The write circuitry, which groups the programming circuit MPR and erase circuit MEF, also comprises a switch SW that makes it possible to switch between the negative and positive voltages as a function of the erase and programming cycles.

The write circuitry also comprises a write controller CTRE, which can be embodied, for example, by software within a microcontroller or by means of logic circuits and that are intended to control the erasing and the programming of the selected cells.

The read circuit MLT comprises a read sequencer SQL, a unit RL intended to generate the different reference values of the read voltages, and conventional read amplifiers SA connected to the read sequencer and to the unit RL.

A conventional state machine MET makes it possible to monitor these different circuits.

The device comprises moreover in a conventional manner a bidirectional data register RD, an address register RAD and a bus interface INTB. Finally, these different programming, erase and read circuit comprises a first decoder DCD1 configured to make selections (to decode) from among the 64 lines CGL and the 512 bit lines BL and a second decoder DCD2 configured to make selections from among the 512 word lines WL.

Figure 10:
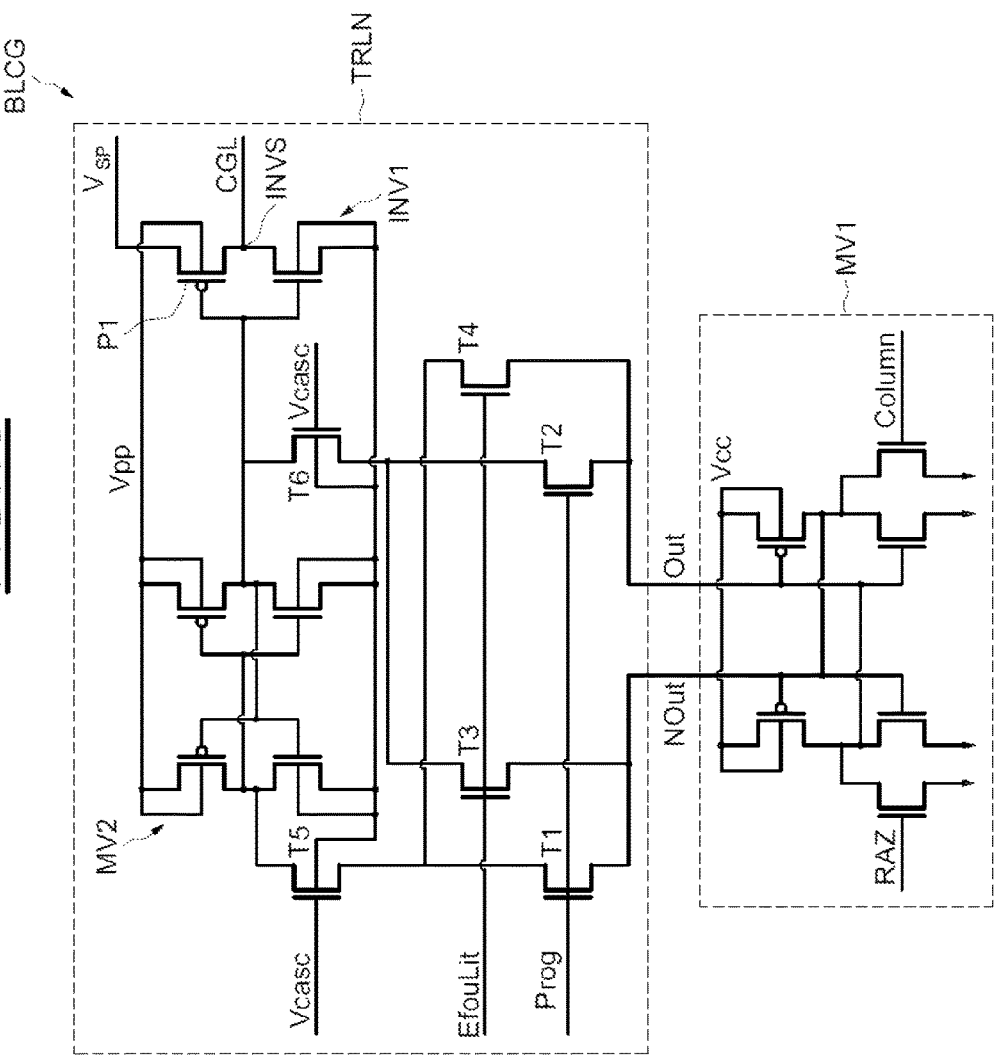

The decoder DCD1 comprises one BLCG unit per CGL line, shown in FIG. 10, the function of which is now described.

During the erase cycle, it must send the erase value (13 volts) on the CGL line of a selected column and 0 volt, for example, on the CGL line of a non-selected column.

The Column signal is at "1" for a selected column and at "0" for a non-selected column.

During the programming phase, it must send the successive values of the programming voltages (−1.6 volt, −2.9 volts, −4.2 volts) on the CGL line of a selected column and 0 volt (for example) on the CGL line of a non-selected column.

For this purpose, the unit BLCG comprises a conventional latch memory MV1 supplied between ground and Vcc (for example 3 volts) followed by a level translator TRLN the N-type MOS transistors of which, having a fourth substrate connection, are produced using triple well technology, for isolating the substrate because of the presence of negative voltages.

The level translator TRLN comprises two NMOS transistors T1 and T2 controlled by a signal Prog and two NMOS transistors T3 and T4 controlled by a signal EfouLit.

The level translator TRLN also comprises two other NMOS transistors T5 and T6 controlled by a signal Vcasc and another latch memory MV2 and an inverter INV1 whose PMOS transistor P1 receives on its source the voltage VSP and whose output INVS delivers the voltage applied to the CGL line.

Table 1 summarizes, according to the different operations (read, erase, programming) the values of the various signals and voltages applied to the BLCG unit and delivered by the latter.

Figure 11:
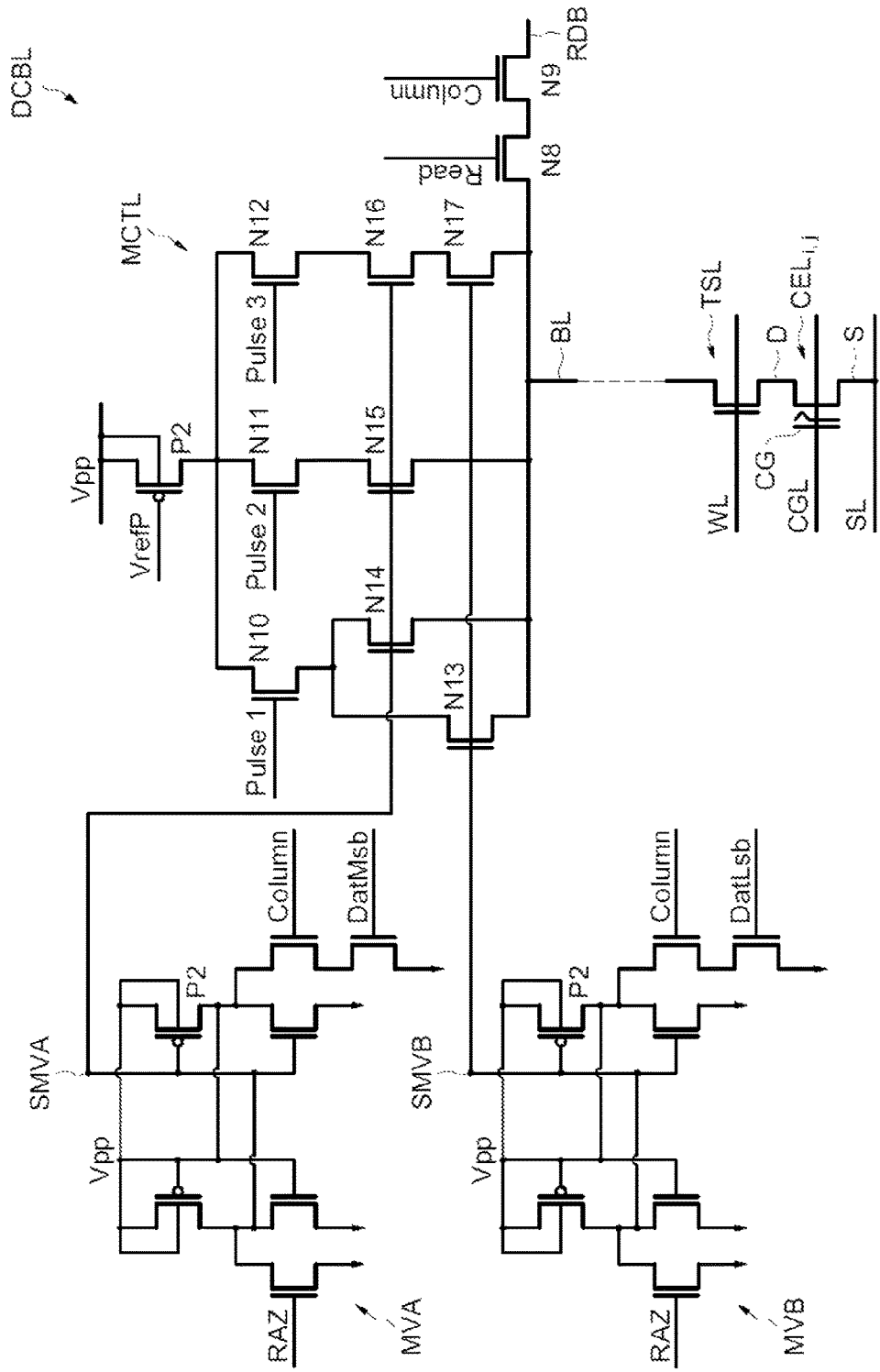

The decoder DCD1 also comprises one bit line decoding unit DCBL per bit line, an example embodiment of which is shown in FIG. 11.

The function of the bit line decoder DCBL is, during writing, to store the data of a byte for the purpose of a future writing and to switch or not switch the high voltage to the bit line during the programming cycle according to the binary value to be programmed and, during reading, to multiplex the bit lines in order to route the bit lines belonging to the selected column to the read amplifiers.

In the example described here, taking account of the fact that an item of data is encoded in two bits, the BCBL unit comprises two latch memories MVA and MVB respectively allocated to the most significant bit DatMsb of the item of data and to the least significant bit DatLsb of the item of data and a module MCTL for controlling the state of the bit line BL in question.

The outputs SMVA and SMVB of the two latch memories MVA and MVB control the gates of the transistors N14-N16 and N13, N17 of the module MCTL. Moreover, three two-state signals pulse1, pulse2, pulse3 respectively allocated to the three programming cycles CP1-CP3 described above control the gates of three transistors N10-N12. In an active state (high) the signal pulse i (i=1, 2 or 3) rises to the high voltage (15 V for example) and in an inactive state (low) the signal is at the low voltage (0 V for example).

As mentioned above, one solution consists in limiting the bit line current in order to stop the programming naturally when the cell is put into conduction. This is here the function of the PMOS transistor P2 connected in a common gate configuration and operating as a current copier (typically 10 nanoamps). The gate voltage VrefP of the transistor P2 of the module MCTL is equal to Vpp−1 volt, which makes it possible to give it a gate-source voltage close to its threshold voltage.

TABLE 1

|  | Read | | Erase | | Programming | |
| --- | --- | --- | --- | --- | --- | --- |
|  | Col not select. | Col select. | Col not select. | Col select. | Col not select. | Col select. |
| Vcc | 3 V | 3 V | 3 V | 3 V | 3 V | 3 V |
| Out | 0 | 3 V | 0 | 3 V | 0 | 3 V |
| Nout | 3 V | 0 | 3 V | 0 | 3 V | 0 |
| EfouLit | 3 V | 3 V | 3 V | 3 V | 0 | 0 |
| Prog | 0 | 0 | 0 | 0 | 3 V | 3 V |
| Vcasc | 3 V | 3 V | 3 V | 3 V | $V_{CGp} < 0$ | $V_{CGp} < 0$ |
| Vpp | 3 V | 3 V | $V_{CGe} \gg 0$ | $V_{CGe} \gg 0$ | 0 | 0 |
| $V_{SP}$ | $V_{CGr} > 0$ | $V_{CGr} > 0$ | $V_{CGe} \gg 0$ | $V_{CGe} \gg 0$ | 0 | 0 |
| Vpn | 0 | 0 | 0 | 0 | $V_{CGp} < 0$ | $V_{CGp} < 0$ |
| INVS | 0 | $V_{CGr} > 0$ | 0 | $V_{CGe} \gg 0$ | 0 | $V_{CGp} < 0$ |

The latch memory MV1 is reinitialized by a write and read pulse RAZ.

In this Table 1, "col" is the abbreviation of "column", "select" is the abbreviation of "selected" and VCGr, VCGe, VCGp respectively denote the voltages to be applied to the control gate when reading, erasing or programming.

The different voltages come from positive or negative charge pump circuits.

Thus, according to whether it is an erase (or read) or programming operation, the connections between the latch memory MV1 and the level translator TRLN are switched such that a selected CGL line receives the high level from the level translator during erasing or reading (13 volts and 1 volt respectively) and the low level from the level translator during programming (−1.6 volt/−2.9 volts/−4 volts).

The bit lines must receive from 0 to 3 programming cycles respectively controlled by the logic signals pulse1, pulse2 and pulse3 according to the possible value of the item of binary data. This is the function of the transistors N10 to N17.

During erasure, pulse1, pulse2, pulse3 are at 0 volt, the source is at 0 volt and the bit line BL is floating. Therefore, for a cell selected by the selection transistor TSL, the drain also changes to 0 volt because the cell is conducting and the source line SL is at 0 volt.

Moreover, during erasure and during programming, the logic signal Read controlling the transistor N8 is at "0" whereas it is at "1" during a read operation.

The "column" signal controls a transistor N9.

The appended Table 2 summarizes the values of the different logic signals, of the outputs SMVA, SMVB and the states of certain transistors and of the bit line BL as a function of the numerical value of the item of data to be written.

TABLE 2

| Data | DatMsb | DatLsb | SMVA | SMVB |
|---|---|---|---|---|
| 00 | 0 | 0 | 0 | 0 |
| 01 | 0 | 1 | 0 | 1 |
| 10 | 1 | 0 | 1 | 0 |
| 11 | 1 | 1 | 1 | 1 |

| Data | N13 | N14 | N15 | N16 | N17 |
|---|---|---|---|---|---|
| 00 | cut off | cut off | cut off | cut off | cut off |
| 01 | conducting | cut off | cut off | cut off | conducting |
| 10 | cut off | conducting | conducting | conducting | cut off |
| 11 | conducting | conducting | conducting | conducting | conducting |

| Data | Pulse 1 = 1 | Pulse 2 = 1 | Pulse 3 = 1 |
|---|---|---|---|
| 00 | BL floating | BL floating | BL floating |
| 01 | BL selected | BL floating | BL floating |
| 10 | BL selected | BL selected | BL floating |
| 11 | BL selected | BL selected | BL selected |

Figure 12:
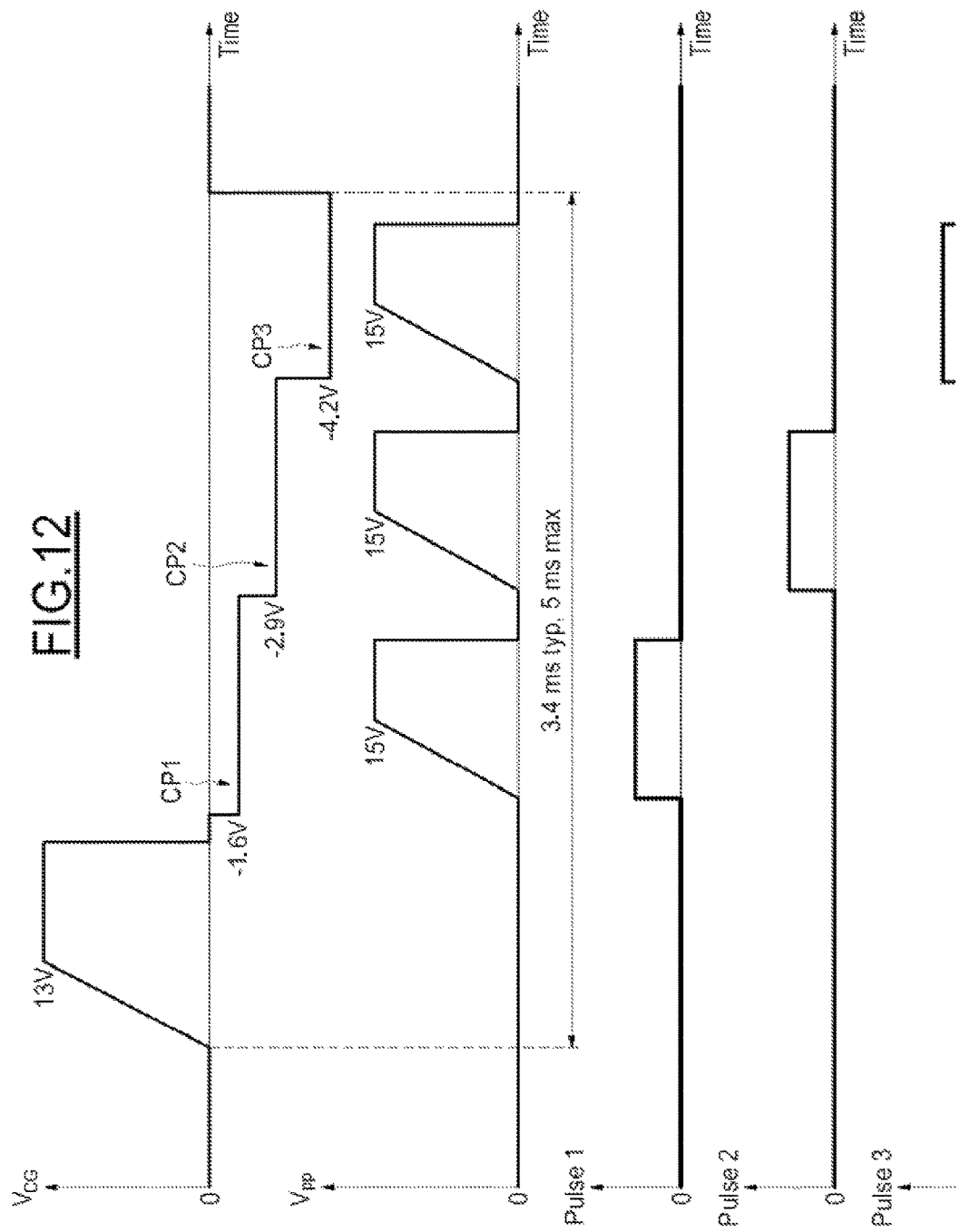

FIG. 12 is a figure similar to FIG. 9 but shows, in its lower section, the value of the logic signals pulse1, pulse2 and pulse3 corresponding to the three programming cycles CP1, CP2, CP3 mentioned above.

Figure 13:
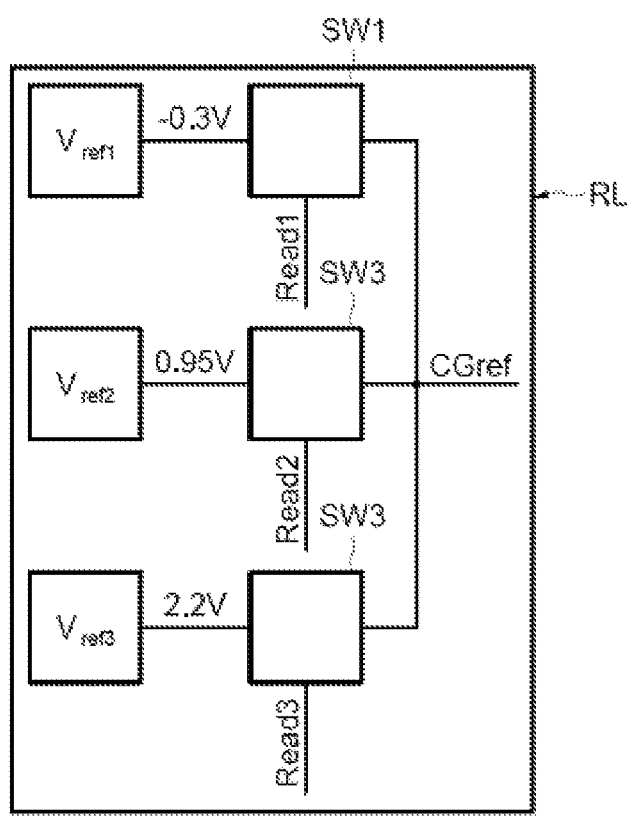
Figure 14:
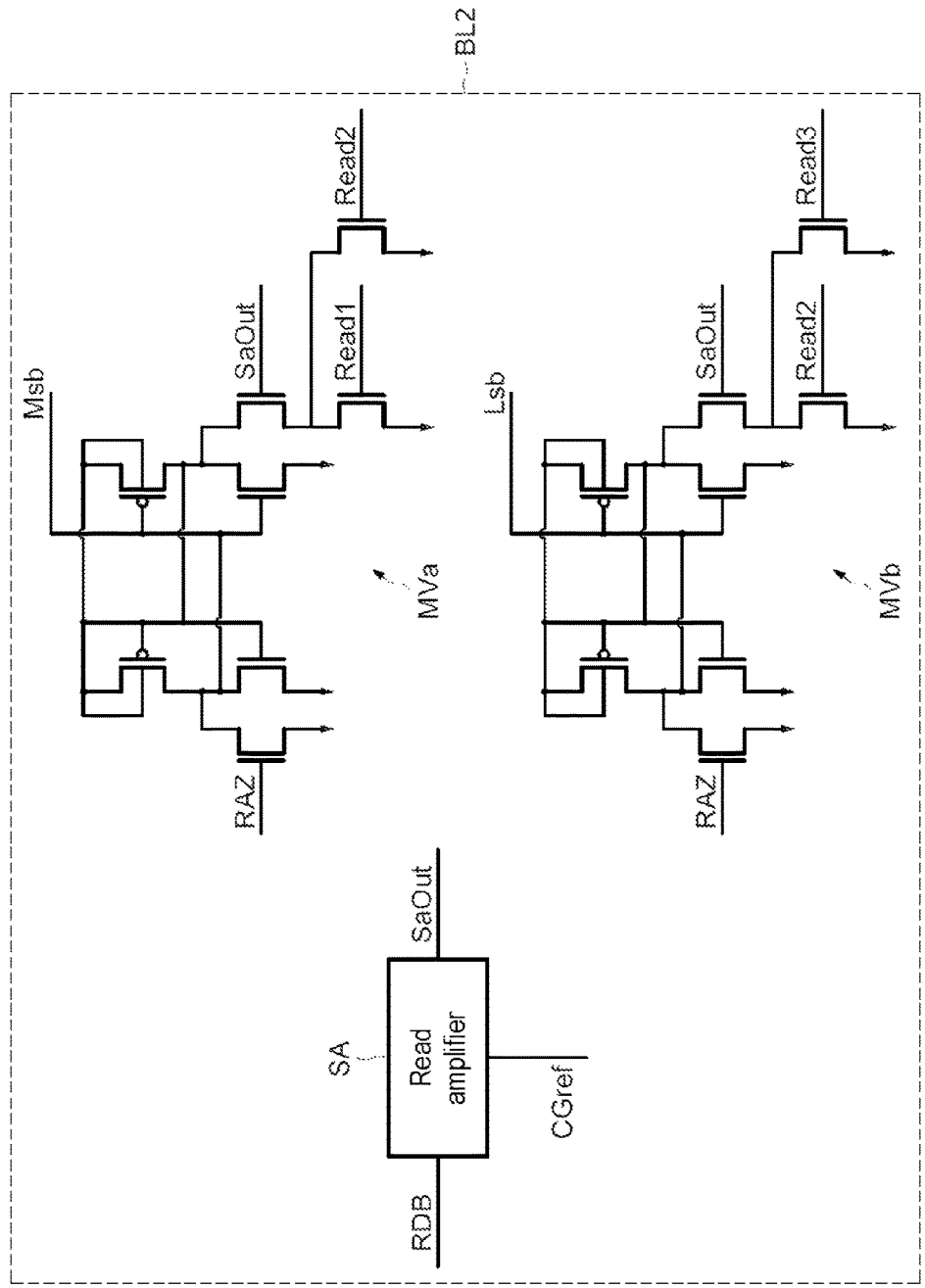

FIGS. 13 and 14 show an example embodiment of the read circuit.

More precisely, in FIG. 13, the unit RL provides on the line the reference value of the voltage applied to the control gate during the reading and also delivered to one of the inputs of the read amplifier as will be seen below.

In the example described here, taking account that there are four conduction thresholds corresponding to four different values of the item of data, the unit RL comprises three reference voltage generators $V_{ref1}$, $V_{ref2}$ and $V_{ref3}$ as well as three switches SW1, SW2, SW3 controlled respectively by three logic signals read1, read2 and read3 in order to select the appropriate reference voltage for delivering on the line $CG_{ref}$. It is appropriate to note that it is possible to have a similar unit for selecting the appropriate gate voltages during the erase and programming phases.

In the example described and taking account of the calculated conduction thresholds, these reference voltages $V_{ref1}$, $V_{ref2}$ and $V_{ref3}$ are respectively taken as equal for example to −0.3 V, 0.95 V and 2.2 V.

The read circuit also comprises a unit BL2 (FIG. 14). This unit comprises a read amplifier SA and two latch memories MVA and MVB (since in the described example, the item of data is encoded in 2 bits). In practice there is one pair of latch memories MVA and MVB per bit line and multiplexed read amplifiers (8 read amplifiers for 512 bit lines).

The input of the read amplifier SA is connected to the bit line decoding unit DCBL (FIG. 11) by the bus RDB and another input is connected to the line $CG_{ref}$ of the unit RL. The output of the read amplifier SaOut is connected to the input of the two latch memories MVa and MVb whose states represent the 2-bit item of binary data derived from three successive reads with the three reference values $V_{ref1}$-$V_{ref3}$, beginning with the lowest value $V_{ref1}$ and ending with the highest value $V_{ref3}$.

The output SaOut is at "1" if the cell is conducting and at "0" if the cell is cut off.

The output Msb of the flip-flop MVa will contain the value of the most significant bit of the read data whilst the output Lsb of the flip-flop MVb will contain the value of the least significant bit of that item of data. Before the three successive reads, the two latch memories are reinitialized (pulse RAZ to the logic "1" state). Table 3 summarizes the content of the two flip-flops MVa and MVb according to different possibilities. In this table, the "read1 result" column indicates the different possible states of the read cell during the first read. The same applies to the "read2 result" and "read3 result" columns for the succeeding two reads.

TABLE 3

| read1 result | read2 result | read3 result | Msb | Lsb | Binary data |
|---|---|---|---|---|---|
| Cell conducting | Cell conducting | Cell conducting | 1 | 1 | 11 |
| Cell cut off | Cell conducting | Cell conducting | 1 | 0 | 10 |
| Cell cut off | Cell cut off | Cell conducting | 0 | 1 | 01 |
| Cell cut off | Cell cut off | Cell cut off | 0 | 0 | 00 |

If of course a cell is conducting during a read associated with "readi", it will be conducting during any following read and the Msb and Lsb values will not be modified during these following reads.

At the end of the three consecutive read steps, the content of the two latch memories MVa and MVb forms a binary word identical to the content of the latch memories MVA and MVB used for programming these items of data.

In all of the above, the various mathematical equations and the calculation of the conduction threshold values have been based, for reasons of simplification, on read currents identical to the bit line current limit during the programming (for example, 10 nA).

In practice the read currents can be higher, for example of the order of 1 microamp.

The conduction threshold of the cell depends on the injected current and a current shift gives rise to a shift of the conduction threshold. This shift is the same whether the cell is blank, written or erased.

In concrete terms, with respect to conduction thresholds calculated for a read current identical to the bit line current limit during programming (for example 10 nA), these conduction thresholds increase by 100 to 200 mV for a higher read current, for example of the order of 1 microamp.

However, this has no effect on the features of the invention.

In fact, in order to take account of this rising of the read current, and therefore of this rising of the conduction thresholds, in the determination of the read reference voltages, one solution consists in determining the conduction thresholds and the read reference voltages on the basis of read currents identical to the bit line current limit during programming (for example 10 nA) and to lower the values of the reference voltages thus obtained by a fixed value (200 mV for example) so that they correspond to the highest read currents (for example 1 microamp). Those skilled in the art will know how to determine this fixed value, knowing the value of the current limit and the real value of the read current.

What is claimed is:

1. A device comprising:
a plurality of memory cells, each memory cell having a transistor with a floating gate, a control gate, a source region and a drain region; and
a write circuit configured to write a selected memory cell with an item of data, wherein the write circuit comprises a programming circuit configured to:
apply a first voltage to the source region;
control the numerical value of the item of data to be written by a control voltage level applied to the control gate;
apply a second voltage to the drain region, the second voltage being higher than the first voltage, the second voltage applied until the cell is put into conduction so that, the item of data is written when the cell is put into conduction with a numerical value corresponding to the control voltage level applied; and
wherein the cell being put into conduction stops the programming;
wherein the item of data is able to take n different numerical values;
wherein the write circuit comprises a generation circuit configured to generate a set of at least n−1 different programming values for the control voltage corresponding respectively to at least n−1 different conduction thresholds of the cell respectively associated with at least n−1 different numerical values of the item of data; and
wherein the write circuit is configured to apply to the control gate of the transistor the control voltage having the programming value corresponding to a desired numerical value of the item of data.

2. The device according to claim 1, wherein n is greater than or equal to 3.

3. The device according to claim 2, wherein n is equal to 3.

4. The device according to claim 1, wherein the cell is erasable by Fowler-Nordheim effect;
wherein the generation circuit is configured to generate a set of n values for the control voltage comprising an erase value corresponding to a first conduction threshold of the cell associated with a first numerical value of the item of data and n−1 different programming values corresponding respectively to n−1 other different conduction thresholds of the cell associated respectively with n−1 other different numerical values of the item of data;
wherein the write circuit further comprises an erase circuit configured to couple the drain and the source of the transistor to ground and to apply to the control gate a control voltage having the erase value; and
wherein the write circuit is configured to apply to the control gate of the transistor the control voltage having the programming value corresponding to a desired numerical value of the item of data and taken from among the n−1 different programming values of the set.

5. The device according to claim 1, wherein at least some of the programming values are negative.

6. The device according to claim 1, wherein the write circuit comprises a voltage generator with current limited to the value of the current of the cell put into conduction, the voltage generator configured to apply the second voltage to the drain of the transistor.

7. The device according to claim 1, wherein the write circuit comprises:
a voltage generator configured to apply the second voltage to the drain of the transistor;
a measuring circuit configured to measure a value of current consumed by the cell;
a comparator configured to compare the value of the current consumed with a threshold and to deliver a control signal if the value of the current consumed exceeds the threshold; and
a control circuit configured to deactivate the voltage generator in response to the control signal.

8. A device comprising:
a plurality of memory cells, each memory cell having a transistor with a floating gate, a control gate, a source region and a drain region; and
a write circuit configured to write a selected memory cell with an item of data, wherein the write circuit comprises a voltage generator and a control circuit configured to:
cause a first voltage to be applied to the source region;
control a numerical value of the item of data to be written by a control voltage level applied to the control gate; and
cause the voltage generate to apply a second voltage to the drain region, the second voltage being higher than the first voltage, the second voltage applied until the cell is put into conduction so that, the item of data is written when the cell is put into conduction with the numerical value corresponding to the control voltage level applied, the voltage generator having current limited to a value of the current of the cell put into conduction, wherein the cell being put into conduction stops the writing.

9. The device of claim 8, wherein the item of data is capable of taking n different numerical values, wherein n>2, wherein the write circuit comprises a generation circuit configured to generate a set of at least n−1 different voltage levels defined for the control voltage to be applied to the control gate of the transistor during the writing and respectively corresponding to at least n−1 different conduction thresholds of the cell respectively associated with at least n−1 different numerical values of the item of data.

10. The device of claim 9, wherein at least some of the control voltage levels are negative.

11. The device according to claim 8, wherein the write circuit comprises:
a voltage generator configured to apply the second voltage to the drain of the transistor;
a measuring circuit configured to measure a value of current consumed by the cell;
a comparator configured to compare the value of the current consumed with a threshold and to deliver a control signal if the value of the current consumed exceeds the threshold; and
a control circuit configured to deactivate the voltage generator in response to the control signal.

12. A method of operating a memory cell, the method comprising:
reading an item of data written in a memory cell, the memory cell comprising a transistor having a floating gate, a control gate, a source region and a drain region, the memory cell capable of having n different numerical values corresponding respectively to n different conduction thresholds of the cell, the reading comprising:
generating a set of at least n−1 reference values for a read voltage to be applied to the control gate of the transistor during a read cycle, the n−1 reference values being respectively situated between the n conduction thresholds;

applying a third voltage to the drain;

applying, to the control gate, a read voltage having a lowest reference value; and if the cell is cut off, applying, to the control gate, a read voltage having a reference value adjacent to a previously applied reference value and repeating with further reference values until a conducting cell is obtained or until all of the reference values have been exhausted.

13. The method of claim 12, further comprising programming the memory cell, the programming comprising:

applying a first voltage to a source region of a transistor, the transistor having a floating gate, a control gate, the source region, and a drain region; and applying a second voltage that is higher than the first voltage to the drain region and applying a control voltage to the control gate until the cell is put into conduction, the conduction of the cell being between the source region and the drain region, a numerical value of an item of data to be written being controlled by the control voltage applied to the control gate, the control voltage being smaller in absolute value than the second voltage, wherein the cell being put into conduction stops the programming.

14. The method according to claim 13, wherein applying the first voltage to the source region comprises connecting the source region to ground during the programming.

15. The method according to claim 13, wherein applying the first voltage to the source region comprises connecting a non-zero first voltage to the source region during the programming.

16. The method according to claim 13, wherein the item of data to be written is capable of taking n different numerical values, wherein n>2 and wherein a set of at least n−1 different programming values is defined for the control voltage to be applied to the control gate of the transistor during the programming and respectively corresponding to at least n−1 different conduction thresholds of the cell respectively associated with at least n−1 different numerical values of the item of data, and wherein, applying the control voltage to the control gate during the programming comprises applying the control voltage having the programming value corresponding to a desired numerical value of the item of data.

17. The method according to claim 16, wherein n=3.

18. The method according to claim 16, wherein at least some of the programming values are negative.

19. The method according to claim 13, wherein applying the second voltage to the drain region comprises applying the second voltage with a voltage generator with current limited to the current consumed by the cell put into conduction.

20. The method of claim 12, further comprising erasing the memory cell, the erasing comprising:

coupling the drain and the source of the transistor to ground; and applying a control voltage having an erase value to the control gate so as to give the cell a first conduction threshold associated with a first numerical value of the item of data.

* * * * *